United States Patent [19]

Volna

[11] Patent Number: 4,867,296

[45] Date of Patent: Sep. 19, 1989

[54] PRECISION ALIGNMENT DEVICE

[75] Inventor: William M. Volna, Minneapolis, Minn.

[73] Assignee: Micro Component Technology, Inc., St. Paul, Minn.

[21] Appl. No.: 127,444

[22] Filed: Dec. 2, 1987

[51] Int. Cl.$^4$ ................................ B65G 15/64

[52] U.S. Cl. ................................ 198/345

[58] Field of Search ............... 198/345, 535, 536, 633, 198/463.4, 463.6; 269/69; 29/33 P; 414/749, 750, 401

[56] References Cited

U.S. PATENT DOCUMENTS

| | | | |
|---|---|---|---|
| 3,888,341 | 6/1975 | Konkal et al. | 198/345 |
| 4,148,400 | 4/1979 | Cross | 198/345 |
| 4,149,620 | 4/1975 | Rosensweig | 198/345 |
| 4,239,445 | 12/1980 | Ozawa | 198/345 X |
| 4,253,559 | 3/1981 | Myers et al. | 198/345 |

*Primary Examiner*—Robert J. Spar
*Assistant Examiner*—James R. Bidwell
*Attorney, Agent, or Firm*—Lawrence M. Nawrocki

[57] ABSTRACT

A device for precisely aligning a shuttle (28) in registration with a track from which the shuttle (28) is to receive an integrated circuit electronic device or into which the shuttle (28) is to deposit such a device. The device includes a shaft (42) disposed for rotation about an axis generally parallel to the axis along which the shuttle (28) moves. Pins (44), one corresponding to each of the tracks from which an integrated circuit electronic device is received within the shuttle (28) and the track or tracks into which such a device is to be deposited by the shuttle (28), extend generally radially from the shaft (42). The shuttle (28) carries a notch plate (54) having an open-sided notch (60) formed therein. The notch is defined by a pair of wall edges of a pair of fingers (56) formed in the plate (54). When the shuttle (28) is in a location approximating an intended position at a particular track, the shaft (42) is rotated so that the pin (44), corresponding to the particular track, is urged into the notch (60). As the pin (44) enters the notch (60), lateral adjustment of the shuttle (28) is effected to precisely register the shuttle (28) with the particular track.

7 Claims, 4 Drawing Sheets

PRECISION ALIGNMENT DEVICE

TECHNICAL FIELD

The present invention deals broadly with the field of apparatus for effecting precision alignment or registration of one structural member with another. For example, the invention can be adapted for employment in an equipment such as an integrated circuit device handler for very precisely aligning a shuttle, disposed for lateral movement across one or more chutes, with each of the chutes across which it moves. In such an application, the invention can be utilized for aligning the first shuttle with each of a plurality of input chutes, and a second shuttle with each of a plurality of output chutes.

BACKGROUND OF THE INVENTION

A plethora of integrated circuit device handlers are known in the prior art. Such handlers receive integrated circuit devices, such as dual in-line packages (DIPs), small-outline integrated circuit (SOIC) devices, and plastic leadless chip carrier (PLCC) devices from an input tray having, typically, a plurality of chutes, singulate a single one of the devices for transferring it to a test site, classify the device tested, and distribute it to an output chute or bin, depending upon its classification.

Various types of these integrated circuit devices are quite small and are singulated and distributed by relatively large shuttles and other components. Close tolerances are, therefore, required for shuttles moving laterally across egress ports from, for example, input tray chutes. Very precise alignment or registration of the shuttle with the chute is, therefore necessary.

A problem effecting precise registration results from the conditions under which testing is typically conducted. The environment in which integrated circuit devices operate in the equipment in which they are to ultimately be installed can include high temperatures. It is desirable, therefore, that such temperatures are simulated at an integrated circuit device handler test site so that optimum test results are achieved.

Because of extreme conditions in the handlers, the structures employed for moving a shuttle can result in undependable positioning of the shuttle at the egress port from a chute. For example, many of the shuttles of the type described are driven by a cable which is run around a sheeve of a drive motor. Frequently, the cable is of a relatively significant length and has a coefficient of expansion such that, when it is subjected to elevated temperatures, expands in a measure sufficient to allow misalignment of the shuttle with the intended chute. As a result, a part might become jammed between the chute and the shuttle, resulting in damage. If a sufficient number of the components being tested are damaged in this matter, significant dollars can be lost.

It is to these problems of the prior art that the present invention is directed. It is a device for extremely precisely effecting alignment and registration of, for example, a shuttle with a chute.

SUMMARY OF THE INVENTION

The present invention is an apparatus for effecting such precise positioning of a shuttle, which moves laterally along an axis, at a station along that axis at which it is intended to be positioned. It includes a plate, carried by the shuttle, the plate having a tapered notch formed therein. The notch is defined by a pair of oblique wall edges which straddle a second axis defined as being generally prependicular to the first axis. Means for laterally adjusting the position of the shuttle when it is proximate its intended location, in order to ensure precise alignment and registration are provided. Such means are fixed at a very precise location along a first axis, and the means, such as a circularly-cylindrical cross-sectioned pin, are movable along the second axis into, and into engagement with the apex of, the tapered notch. The precise location of the means, such as the pin, along the first axis, is designed to be such that, when the pin is received in the apex of the notch, the shuttle will be positioned exactly as desired.

Typically, such a shuttle is disposed for movement, in the direction of the axis along which it moves, along a track. In accordance with the present invention, the shuttle can be provided with a pair of track riders which ride on a track on a side of the shuttle opposite a side from which the pin enters the notch formed in the plate carried by the shuttle. Typically, the track riders would straddle the axis along which the pin enters the notch. As the pin enters the notch and bears down upon the apex of the notch, not only will the shuttle become precisely registered with the chute, therefore, but the shuttle will also become squared with a tray in which the shuttle is formed so that the path of a device passing down the chute will continue linearly through both the chute and the shuttle. That is, the path in the shuttle will not be canted with respect to the path in the chute.

In a preferred embodiment, the alignment pin is mounted to a shaft having an axis of elongation parallel to the axis along which the shuttle moves. Entry of the pin into the notch is effected by rotating the shaft to urge the pin into the notch.

It is envisioned that the pin can be provided with a base portion and a portion distal with respect to the shaft to which it is mounted. When such is the case, the base portion is disposed for selective concentric rotation within the shaft in which it is mounted. The distal portion is made eccentric with respect to the base portion, so that, as the base portion is rotated, the location of the distal portion along an axis parallel to the axis along which the shuttle moves can be selectively varied.

As previously indicated, a typical manner for laterally moving the shuttle is one which employs a cable secured at a point thereon to the shuttle. The cable is, in turn, driven by a drive motor. Because of the substantially rigid linkage between the drive moter, the cable, and the shuttle, the adjustment of the shuttle positioning in accordance with the present invention will tend to "drag" the motor along with the shuttle. It is envisioned, therefore, that means be incorporated in the shuttle to allow the fine-tuning of the shuttle in its intended station without effecting the motor. Such means can include a cartridge, mated to the cable, and received within a cavity, elongated along the axis along which the shuttle moves, formed in the shuttle. The cartridge is normally maintained at a defined position with respect to the shuttle relative to the first axis. Means, such as springs, can be provided, however, to allow a change of relative position of the cartridge with respect to the shuttle when the lateral position of the shuttle is adjusted as a result of a pin entering the notch formed in the plate.

The present invention is thus an improved device for effecting precision alignment and registration of a shuttle with, for example, a chute in a tray carrying integrated circuite devices. More specific features and advantages obtained in view of those features will become apparent with reference to the DETAILED DESCRIPTION OF THE INVENTION, appended claims, and accompanying drawings.

DETAILED DESCRIPTION OF THE INVENTION

Figure 1:
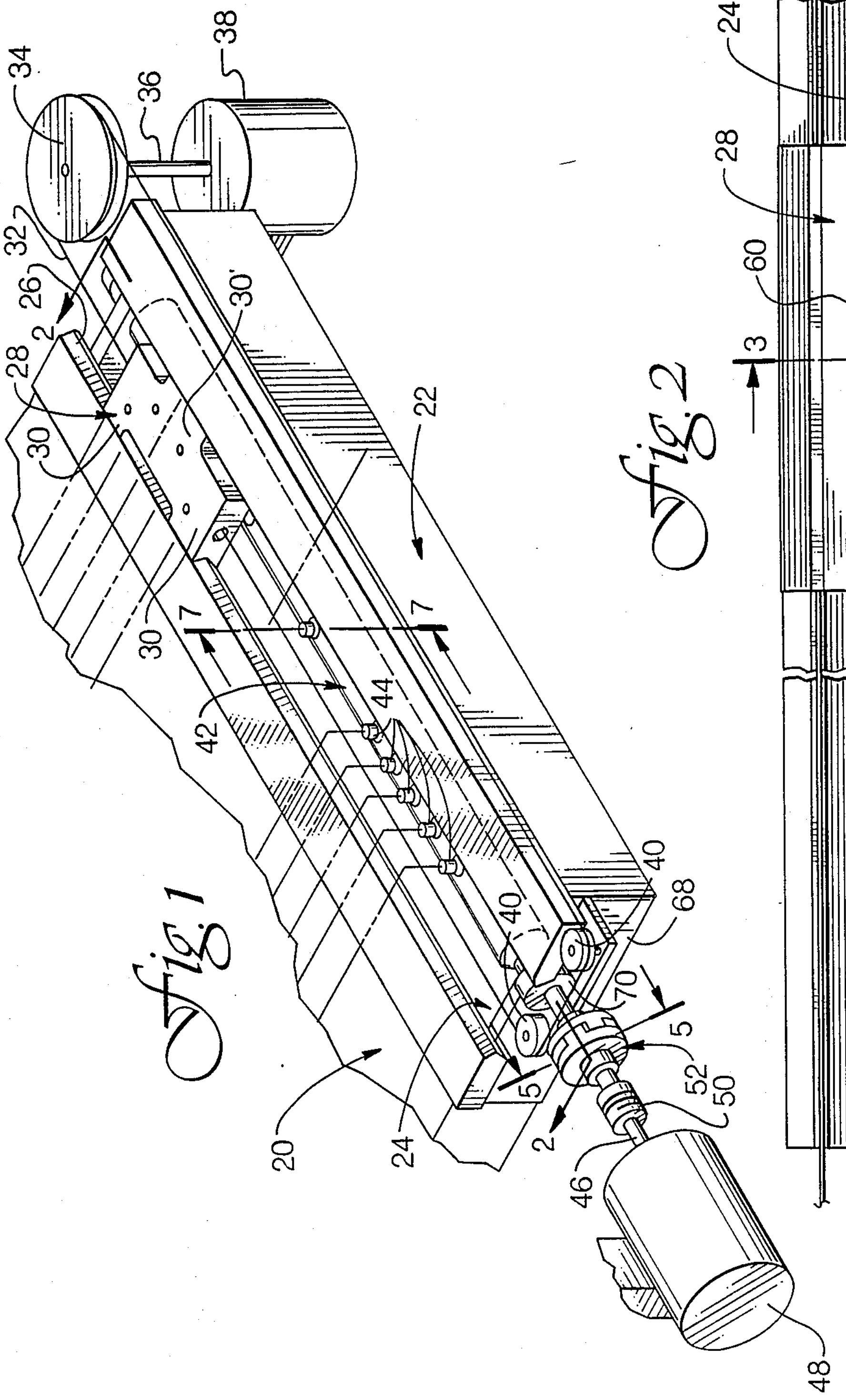
FIG. 1 is a perspective view of a shuttle, employing the present invention, in combination with a tray having chutes down which integrated circuit devices pass.

Referring now to the drawings wherein like reference numerals denote like elements throughout the several views, FIG. 1 illustrates an input tray 20 as typically used in an integrated circuit device handler having a plurality of tracks (not shown) down which integrated circuit devices (not shown) pass. A lower frame portion 22 is spaced from the main tray assembly 20, and the main assembly 20 and the lower portion 22 define a channel 24 therebetween. Each inward facing edge of the channel 24 is provided with a track 26, and a shuttle 28, received within the channel 24, is provided with track riders 30, 30' which engage and ride along these tracks 26.

The shuttle 28 is disposed for movement along an axis aligned along the tracks 26. A cable 32 affixed to the shuttle 28, extends, at one end of the trough 24, around a sheeve 34 mounted to the shaft 36 of a drive motor 38. At the other end, the cable 32 extends around a pair of idler sheeves 40. The run of the cable 32 in one direction, therefore, passes through the trough 24, extending through the shuttle 28, and the run of the cable in the other direction extends along a path outside of the trough 24.

As will be able to be seen in view of this disclosure, actuation of the drive motor 38 will result in rotation of the drive shaft 36 and corresponding rotation of the sheeve 34 affixed thereto. Rotation of that sheeve 34 will, in turn, be translated into linear motion of the shuttle 28 along the tracks 26 straddling the trough 24.

The depth of the trough 24 is sufficient so that a shaft 42 having at least one pin 44 extending therefrom can be received beneath the path of the shuttle 28. The shaft 42 is journaled in position by any appropriate means (not shown in FIG. 1). This shaft 42 is, in turn, linked to the drive shaft 46 of a second motor 48 by a coupler 50 and torsion clutch 52 which will be described hereinafter with regard to FIGS. 5 and 6. In any case, however, suffice it to say that rotational motion of the motor 48 is indirectly transmitted to the shaft 42 disposed within the trough 24.

The shuttle 28 carries a depending plate 54 which is mounted to the under side of the shuttle 28. The plate 54 has a pair of fingers 56 formed therein, inwardly facing edges 58 of the pair of fingers 56 defining a tapered notch 60.

Figure 4:
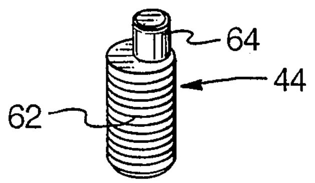
FIG. 4 is a perspective detailed view of a pin for effecting functioning of the present invention.

As previously mentioned, the shaft 42 disposed in the trough 24 beneath the shuttle 28, as previously indicated, has a plurality of radially extending pins 44. FIG. 4 illustrates such a pin 44. As seen in that figure, the pin 44 includes a base portion 62 and an axially extending distal portion 64. The distal portion 64, as seen in FIG. 4 is eccentric with regard to the base portion 62.

Figure 3:
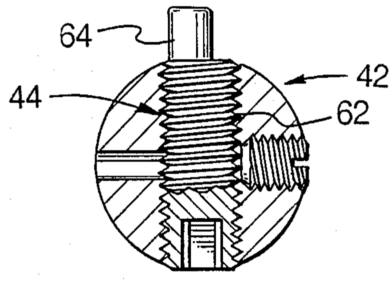
FIG. 3 is a sectional view taken generally along the line 3—3 of FIG. 2.

FIG. 4 illustrates the base portion 62 of the pin 44 as being externally threaded. As seen in FIG. 3, the shaft 42 has an aperture internally threaded, to receive the pin 44. FIG. 3 illustrates a solid shaft 42 wherein rotation of the pin 44 within the aperture in which it is received can be precluded by means of a set screw 66 engaging the threads of the pin 44 through an aperture in the shaft 42 angled relative to the base portion 62 of the pin 44. It will be understood, however, that other embodiments are specifically contemplated.

In another embodiment, the shaft 42 is bifurcated, and screws, at various spaced axial locations, hold the two bifurcated portions together. By tightening the two bifurcated portions tightly together, rotation of the pin or pins can be precluded.

As will be able to be seen in view of this disclosure, rotation of a pin 44 will adjust the position of the distal portion 64 thereof in a direction along the axis of the shaft 42. The reason for providing such a feature will be discussed hereinafter.

Figure 2:
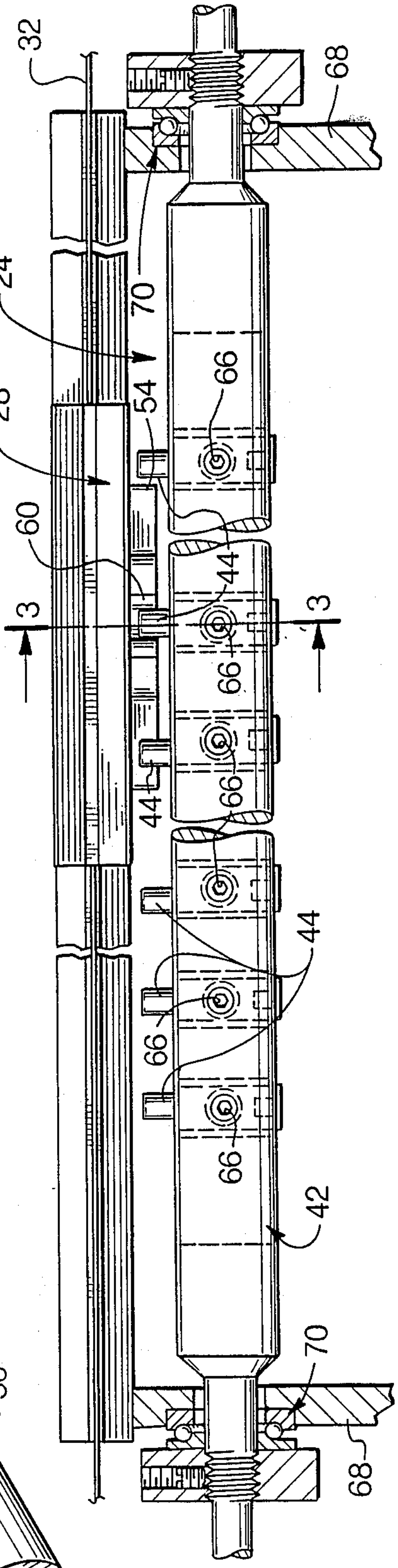
FIG. 2 is a sectional view taken generally along the line 2—2 of FIG. 1.

FIG. 2 illustrates the manner in which the shaft 42 is journaled to the side walls 68 of the tray frame. A pair of preloaded thrust bearings 70, the structure of which is known in the prior art, is employed for this purpose. One of each of the bearings 70 is disposed at each of the axial ends of the shaft 42 at its location of being journaled to the corresponding side wall 68. Consequently, the shaft 42 is maintained at a fixed axial position within the trough 24, and axial movement of the shaft 42 within the trough 24 is precluded.

FIGS. 1 and 2 both illustrate a plurality of pins 44 extending radially from the shaft 42. These pins 44 are intended to be posited at exact desired positions relative to the chutes in the tray 20. Once positioning is effected, they can be so maintained because of the immobility of the shaft 42 in the axial direction.

In operation, the first motor 38 is directed to step the shuttle 28 to the exact location of a chute having a device which is to be released. Optics (not shown) can be employed to sense the presence of a device to be released. Processor means (not shown) are utilized to step the motor 38 the right amount in order to effect this function of the shuttle 28.

Even with sophisticated electronic equipment, however, sufficiently precise positioning is typically not able to be effected. This is true particularly in view of the tolerances necessary.

The situation is further aggrevated, however, because of temperatures to which a handler is elevated in order to simulate the operating environment of the devices to be tested. Consequently, the electronics employed to effect stepping of the motor 38 can be less than completely accurate. Further, as previously pointed out in this document, the temperatures can effect expansion or contraction of the drive cable 32 resulting in imprecision.

In any case, however, both the electronics and the cable 32 will be sufficiently reliable to position the shuttle 28 at approximately the intended position. The pins 44 carried by the shaft 42 are disposed at locations closely proximate the center of the defined position of the shuttle 28.

In some cases it will be necessary to vary the location of the pins 44, and this can be done by rotating the necessary pin or pins within the apertures in the shaft 42 in which they are received. As previously discussed, the eccentricity of the distal portion 64 of the pin 44 relative to the base portion 62 will allow for an apparent axial movement of the distal portion 64 along the shaft 42 mounting the pins 44. In this manner, the pins 44 can be positioned so that the distal portions 64 thereof are disposed in exact desired locations in order to effect necessary precise alignment and registration of the shuttle 28 with the various chutes with which it is to be registered.

As best seen in FIGS. 8–11, rotation of the shaft 42, when the shuttle 28 is in a position closely proximate an intended position will result in the distal portion 64 of the corresponding pin 44 entering the notch 60 formed in the shuttle plate 54. Conceivably, the pin distal portion 64 will be in precise alignment with the notch 60, and the pin 44 will not have any tendency to drive the shuttle 28 one way or another. With this positioning of the pin 44 relative to the notch 60, it would be confirmed that the shuttle 28 is in precise registration with the chute.

Figure 9:
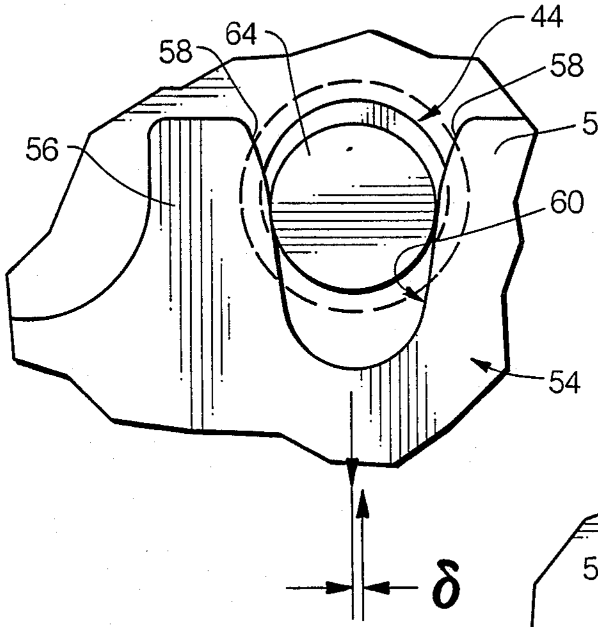
FIG. 9 is an enlarge detailed view of the structure illustrated in FIG. 8.
Figure 10:
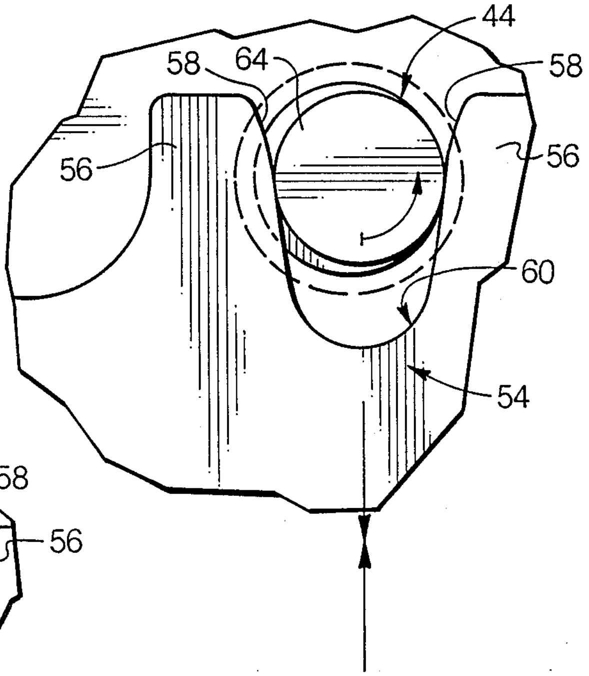
FIG. 10 is a view similar to FIG. 9 with elements in alternative positions.

FIG. 9 illustrates a situation wherein the shuttle 28 is misaligned by an amount indicated by the letter δ. If such misalignment occurs, the particular pin 44 is rotated, after releasing the set screw 66 or clamping means holding the pin 44 against rotation, to adjust the axial position of the pin's distal portion 64 along the shaft 42 to which the pin 44 is mounted. Once the desired correspondence between the pin distil portion 64, the notch 60, the shuttle opening, and the chute is achieved, the pin 44 is again locked into place. FIG. 10 illustrates the position of the pin 44 after adjustment and wherein δ has been eliminated.

Once the desired adjustment has been achieved, the machine can be operated, and rotation of the shaft 42 in order to effect entry of the pin 44 into the notch 60 formed in the shuttle plate 54 will accomplish precise registration of the shuttle 28 with the corresponding chute. This is so since, if the shuttle 28 is out of alignment, the pin's distal portion 64 will engage one of the side edges 58 of the notch 60 first, and, as the pin 44 continues to be rotated, the shuttle 28 will be driven in one direction until the pin distal portion 64 becomes symmetrical with the notch 60. Once symmetry has been achieved, alignment ocurs.

As will be able to be garnered from the discussion to this point, the diameter of the pin distal portions 64 should be smaller than the entrance to the notch 60 yet larger than the apex. With such a correspondence of dimensions, the pins 44 will be able to enter the notch 60 but will not achieve the apex. If full entry of a pin 44 into a notch 60 were able to be accomplished (for example, if the diameter of the pin 44 were significantly smaller than the width of the notch 60 at its apex) alignment and registration could not be effected since the pin 44 would be incapable of making the notch 60 symmetrical thereto.

Figure 11:
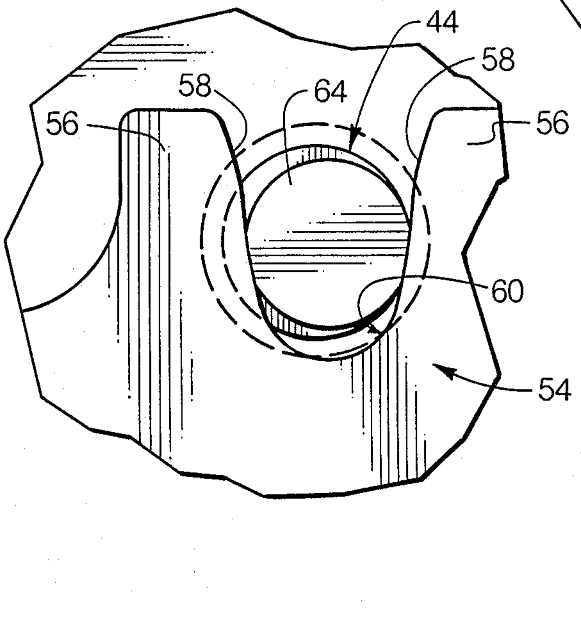
FIG. 11 is a view similar to that of FIG. 10 illustrating elements in worn configurations.

FIG. 11 illustrates a situation that can occur after numerous operations of the equipment. After millions of cycles, there will tend to be some measure of erosion of the inner facing edges 58 defining the notch 60 and of the distil portions 64 of the pins 44. The ability of the equipment to align and register the shuttle 28 will not, however, be diminished. The pin 44 will merely be received more deeply in the notch 60 when alignment is being effected. As might be surmised, after billions, or perhaps trillions of cycles, the relationship betwen the pin 44 and the notch 60 might become such that alignment could no longer be effected. At that point, however, the handler would probably have long since ceased to function.

Conceivably, as wear occurs as cycles are run, one edge 58 of the notch 60 or one side of the pin 44 might become worn to a greater extent than the other side of the notch 60 or the other side of the pin 44. As a result, the alignment effected might become less than precise. A mere adjustment to the eccentricity of the distal portion 64 of the pin 44, however, would correct the situation.

Figure 8:
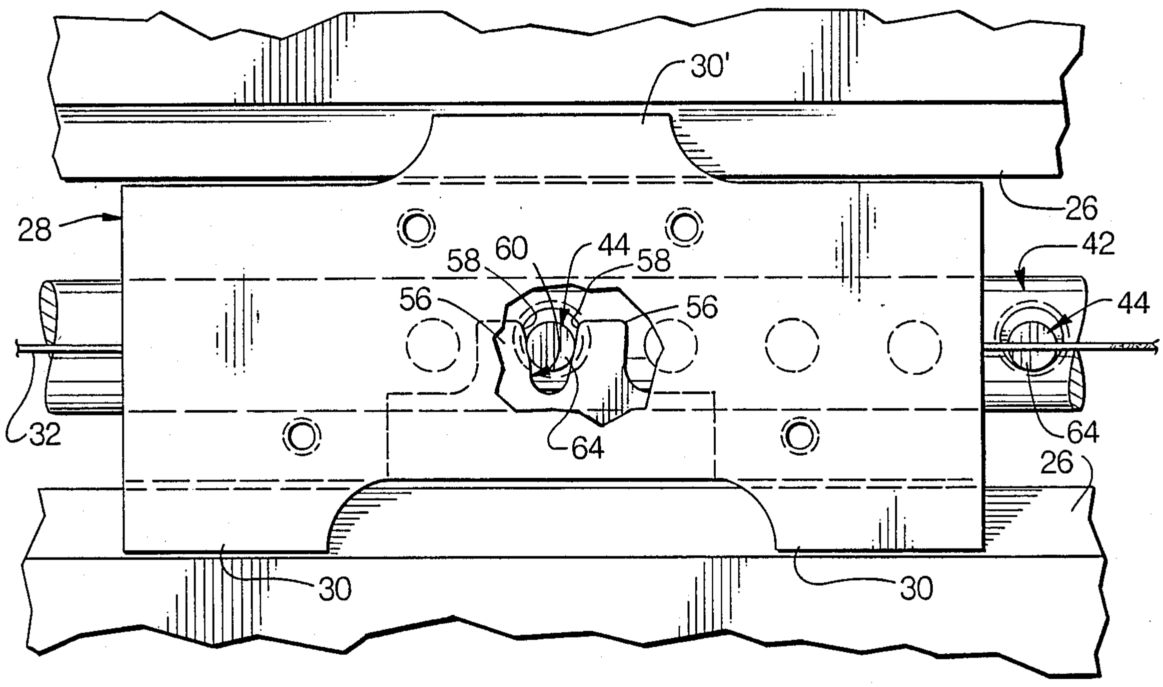
FIG. 8 is an auxiliary top plan view taken generally along the line 8—8 of FIG. 7.

As previously discussed, one side of the shuttle 28 might be provided with dual track riders 30. These track riders 30 are best seen in FIGS. 1 and 8. These track riders 30 are on a side of the shuttle 28 opposite the direction from which the pin 44 enters the notch 60. As the pin 44 enters the notch 60, not only will the shuttle 28 be precisely aligned and registered, therefore, but the pin 44 will also exert force upon the shuttle 28 to drive the two track riders 30 into tight engagement with the rail 26 with which they are associated. Consequently, the shuttle 28 will become squared with respect to the rail 26 so that the path of the device entering the shuttle 28 will be linear along its full length. That is, that portion of the path in the shuttle 28 will not be canted with respect to the portion of the path defined by the chute.

Figure 12:
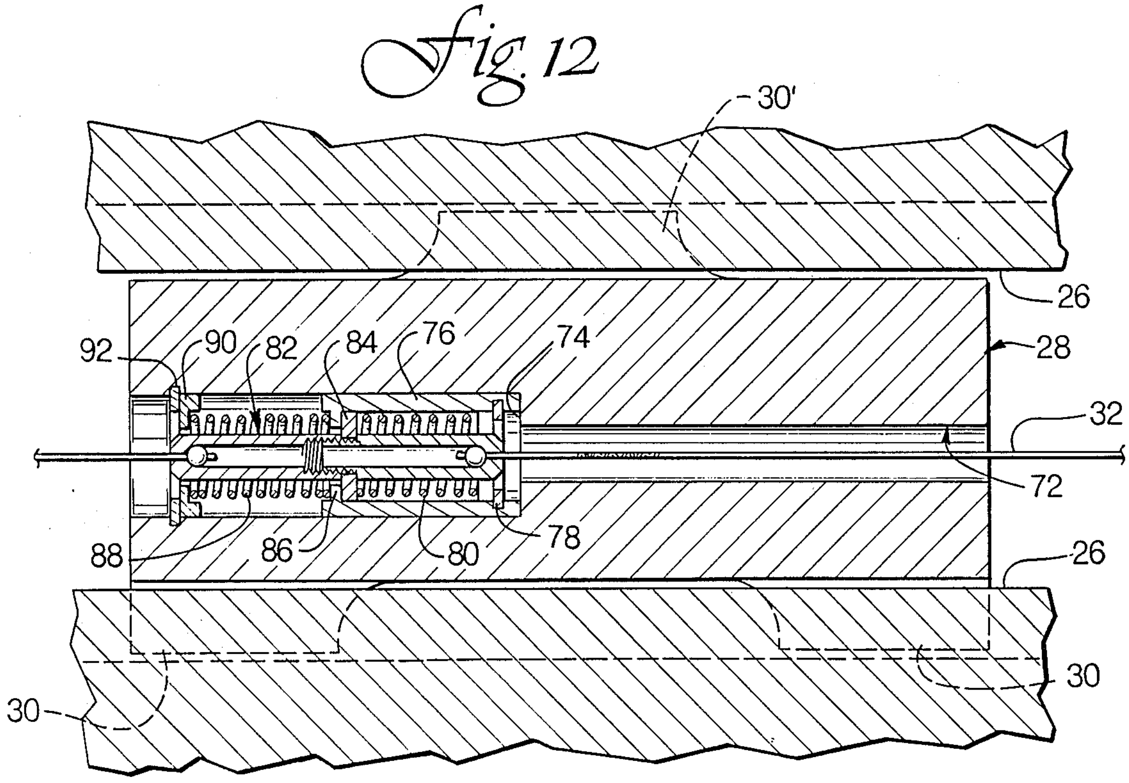
FIG. 12 is an auxiliary top plan sectional view taken generally along the line 12—12 of FIG. 7.

FIG. 12 illustrates a mechanism which can be employed for allowing the shuttle 28 to move slightly when precise alignment is effected without dragging the motor 38. A cavity 72 extends through the shuttle 28 along an axis along which the shuttle 28 moves. The cavity 72 is slightly larger at one end than at the other so that a shoulder 74 is thereby defined. A sleeve cylinder 76 is inserted into the larger portion of the cavity 72 to abut this shoulder 74. A snapring retainer 78 serves to, either directly or indirectly, engage one end of a first coil spring 80. The coil spring 80 surrounds an end of a cartridge 82 to which one end of the cable 32 is attached. The snapring retainer 78 has an aperture centrally therein which is sufficiently large to accommodate the cartridge 82 to pass thereto.

The sleeve cylinder 76 has a piston 84, at its opposite end, which engages the other end of the first coil spring 80. Additionally, the piston 84 is axially fixed with regard to the cartridge 82 so that, as the piston 84 is moved, the cartridge 82 will be also. Conversely, it can be said that, as the cartridge 82 is drawn in one direction, the piston 84 will be also.

An end of the sleeve cylinder 76 to the left as viewed in FIG. 12, is provided with an inwardly extending annular flange 86. A second coil spring 88 is inserted into the cavity 72, a first end being made to engage this flange 86. A keeper 90 is, thereafter, inserted to engage the opposite end at this coil spring 88. The keeper 90 is maintained in place by a second snapring 92. Central apertures are provided in the snapring 92 and keeper 90 to permit the cartridge 82 to pass therethrough. A second end of the cable 32 is secured to the cartridge 82 at this end (the left end, as view in FIG. 12).

If the shuttle 28 is moved to the right, as seen in FIG. 12, as a result of the precision alignment, the cartridge 82 will still be able to be maintained in its original position, the left coil spring 88 being compressed to adjust for this relative movement. Once the pin 44 is retracted from the notch 60 in the plate 54 carried by the shuttle 28, the coil spring 88 will extend to return the shuttle 28 and the cartridge 82 to their previous relative relationship.

If the shuttle 28 is driven to the left, as viewed in FIG. 12, in view of a pin 44 entering the notch 60, the cartridge 82 will, again, be able to be maintained in its original position, the right coil spring 80 being compressed to account for this relative movement. Again, once the pin 44 is retracted from the notch 60, the pin 44 will extend to return the shuttle 28 and cartridge 82 to their original relative positions.

In the case of the shuttle 28 being drawn in either direction, however, it will be seen that the cartridge 82 will remain in its actual position. Consequently, there will be no drag imposed upon the motor 38. It will be noted that spring operation in one direction of movement of the shuttle 28 relative to the cartridge 82 is totally independent of spring operation in the other direction.

Figure 6:
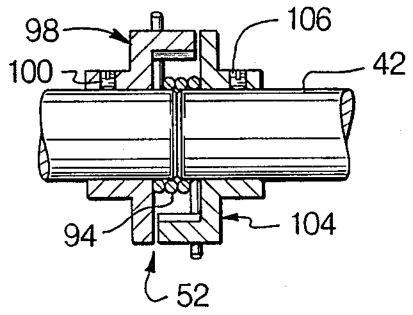
FIG. 6 is a sectional view taken along line 6—6 of FIG. 5.
Figure 5:
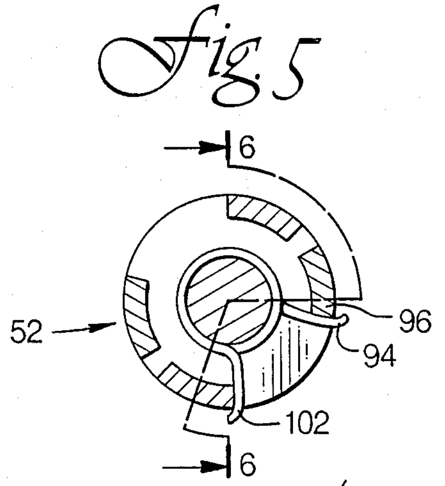
FIG. 5 is a sectional detailed view taken generally along the line 5—5 of FIG. 1.
Figure 7:
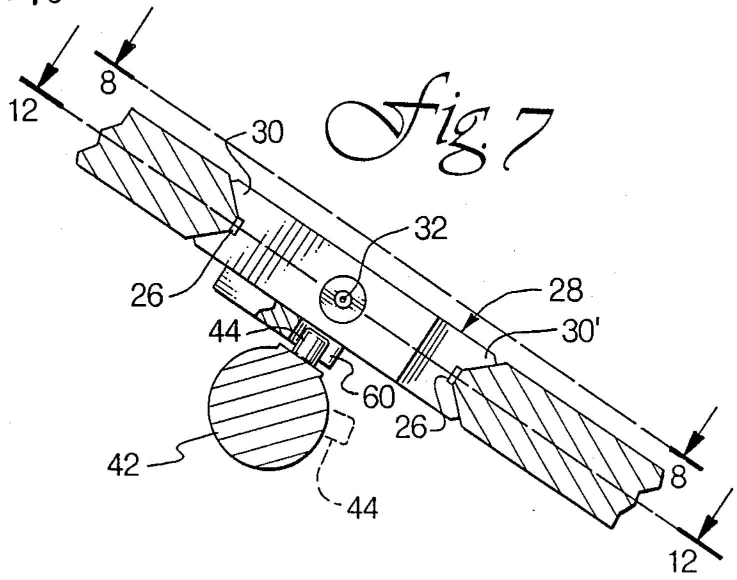
FIG. 7 is a sectional view taken generally along line 7—7 of FIG. 1.

Referring now to FIGS. 5 and 6, the torsion clutch 52 is illustrated in more detail. The torsion clutch 52 serves a purpose with respect to angular movement imposed upon the shaft 42 by the second motor as does the assembly described with regard to FIG. 12 serves with respect to the linear movement imposed by the first motor 38.

As can be seen in FIG. 6, the shaft extending from the motor 48 is discontinuous. That is, it is bifurcated within the torsional clutch 52. Rotation of the motor 48 attempted to be induced but which is not able to be effected because a pin 44 has fully entered the notch 60 is absorbed by the clutch 52.

A torsion spring 94 winds around the abutting ends of the motor shaft 42 and the shaft 42 from which the pins 44 radially extend. One end of the spring 94 engages a circumferential shoulder 96 carried by a member 98 secured to the motor shaft (typically by a set screw 100). The other end of the spring 94 engages another circumferential shoulder 102 carried by another member 104 secured to the shaft 42 from which the pins 44 radially extend (again, typically, by a set screw 106). The spring 94 will tend to maintain the shafts at one position of relative relationship. Rotation is induced by the motor 48, and torsion imposed by the spring 94 is overcome. With the motor 48 still attempting to effect rotation even after the pin 44 has achieved the apex of the notch 60, torsion will be absorbed by the spring 94.

Stops 108 can be provided to preclude relative rotation after the pin 44 has engaged the apex of the notch 60. The amount of torsion absorbed by the torsional clutch 52, therefore, can be limited.

Numerous characteristics and advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. Apparatus for precisely positioning a shuttle, for carrying integrated circuit electronic components, movable laterally along a first axis, at a station at which it is to be stopped to receive or release an electronic component carried thereby, comprising:

(a) a member carried by the shuttle, said member having a tapered notch formed therein, said notch defined by a pair of wall edges straddling a second axis generally perpendicular to said first axis, said wall edges defining a notch open on a side thereof; and (b) means, fixed at a location along the first axis, movable along an axis generally parallel to said second axis into said notch through said open side thereof, for adjusting the position of the shuttle along the first axis as said means moves into said notch and rides into an apex of said notch;

(c) wherein said location along said first axis at which said laterally adjusting means is fixed is such that, when said laterally adjusting means is received in said apex of said notch, said shuttle will be positioned precisely at the station.

2. Apparatus in accordance with claim 1 wherein the shuttle rides, along said first axis, on a track, the shuttle further including a pair of track riders extending from the shuttle on a side thereof opposite a side from which said laterally adjusting means enters said notch, and straddling, in a direction along said first axis, the apex of said notch.

3. Apparatus in accordance with claim 1 wherein said laterally adjusting means comprises a pin having a generally circularly cylindrical cross-section.

4. Apparatus in accordance with claim 3 wherein said pin is disposed for revolution about an axis generally parallel to said first axis, and into said notch.

5. Apparatus in accordance with claim 3 wherein said pin comprises a base portion and a distal portion, which enters said notch, eccentric with respect to said base portion, said base portion disposed for selective concentric rotation about an axis; wherein, as said base portion is rotated, the location of said distal portion along said first axis is varied.

6. Apparatus in accordance with claim 1 wherein the shuttle is moved along the first axis by a cable connected to the shuttle, the cable driven, in turn, by a drive motor; said apparatus further including means for permitting lateral adjustment of the shuttle to effect precise positioning thereof without transmitting the adjustment motion back to the drive motor through the cable.

7. Apparatus in accordance with claim 6 wherein the shuttle has a cavity, elongated along said first axis, formed therein and wherein said permitting means comprises:

(a) a cartridge, mated to the cable, received within said cavity, and normally maintained at a defined position, relative to said first axis, with respect to the shuttle; and (b) means, when the lateral position of the shuttle is adjusted as a result of said laterally adjusting means entering said notch, for allowing a change of position, relative to said first axis, of said shuttle with respect to the cartridge.

* * * * *